United States Patent [19]
White

[11] Patent Number: 4,749,359
[45] Date of Patent: Jun. 7, 1988

[54] SECURITY OVERRIDE NETWORK INTERFACE DEVICE

[75] Inventor: Stephen D. White, Argyle, Tex.

[73] Assignee: Siecor Corporation, Hickory, N.C.

[21] Appl. No.: 90,132

[22] Filed: Aug. 27, 1987

[51] Int. Cl.$^4$ ............................................. H01R 13/44
[52] U.S. Cl. ....................................... 439/133; 174/60; 379/399; 379/419; 379/437; 379/438; 439/144; 439/718; 439/892
[58] Field of Search ............... 439/133, 142, 143, 144, 439/145, 146, 535, 536, 718, 892; 379/27, 399, 412, 419, 437–439; 174/60

[56] References Cited

U.S. PATENT DOCUMENTS

| | | | |
|---|---|---|---|
| 2,978,613 | 4/1961 | Hein | 439/133 |
| 4,466,679 | 8/1984 | St. Germain et al. | 439/142 |
| 4,488,008 | 12/1984 | Dellinger et al. | 179/179 |
| 4,614,389 | 9/1986 | Albert et al. | 439/144 |
| 4,624,514 | 11/1986 | Smith | 379/412 |
| 4,647,725 | 7/1987 | Dellinger et al. | 329/29 |
| 4,700,384 | 10/1987 | Meyer | 439/892 |

Primary Examiner—Gil Weidenfeld
Assistant Examiner—Paula A. Austin
Attorney, Agent, or Firm—David Abernethy

[57] ABSTRACT

A telephone network interface device having differing means for access for the public utility, building owner or apartment manager, and those living in individual housing units; differing means of access provided in part by a latchpiece inserted between a first gate leading to a subscriber compartment and a second gate leading to the utility compartment. Also described is a container using the latchpiece.

7 Claims, 4 Drawing Sheets

SECURITY OVERRIDE NETWORK INTERFACE DEVICE

BACKGROUND OF THE INVENTION

1. Field of the Invention

The invention relates to network interface devices and containers suitable therefor.

2. Description of the Related Art

A telephone network interface device was disclosed in U.S. Pat. No. 4,647,725 granted to Thomas A. Dellinger, et al. The philosophy behind the telephone network interface device is that, in the age of separate ownership of premise wiring by a subscriber, means are needed to indicate whether a system fault is in the portion of the loop owned by the telephone company or other utility or the portion of the network owned by the subscriber. In putting the concept into practice, it has been customary in the industry to provide a device with separate compartments, one compartment designed for access by the telephone company only and the other compartment designed for access by both the telephone company and the subscriber.

Many telephone network interface devices used in the industry today provide a container, a first door which is locked to the container, and a second door which is locked only to the first door. The first door leads to the telephone company terminals and the second door leads to the subscriber access area. The subscriber may open a lock between the two doors, but only the telephone company can open the lock between the first door and the container.

SUMMARY OF THE INVENTION

The invention is designed having in mind with a building with a number of dwelling units, offices, or other separate spaces. In such an environment, those in possession of individual units will desire an individual network interface in order to test the wiring in their own individual units. The possessor of an individual unit should only have access to the jack or jacks pertaining to his portion of the building. Therefore, a number of separate jack and plug mechanisms are needed.

The building manager or owner has different needs. This person needs to be able to access all network interfaces of the individual dwelling units.

The third entity having individualized needs is the telephone company, or other utility. The telephone company needs to be able to access any portion of the total network interface device unit. Therefore, a need exists for a network interface device unit wherein an individual dweller can have access to an individualized set of jacks and plugs, but not any other portion of the unit; the building manager must be able to access the entire set of jacks and plugs for the building units, but not the portion of the network interface device preserved for the telephone company or other utilities; and, the telephone company or other utility needs some separate compartment which cannot be accessed by an individual dwelling unit owner or the building manager. Furthermore, the telephone company needs to be able to access all other portions of the device. This creates problems when the building manager is not available. The building manager's access needs to be locked to keep out intruders; yet, it is desirable that the telephone company or other utility be able to override the building manager's lock in order to obtain access to the entire unit without having to gain possession of the building manager's key. The disclosed invention provides a way to satisfy all these needs.

Therefore, the invention provides a container having a lid and at least first and second compartments therein, a first entrance way to the first compartment and a second entrance way to the second compartment; a first gate for opening or closing the entrance way into the first compartment and a second gate for opening or closing the entrance way into the second compartment; means for locking the first gate; first unlocking means (for the building manager) for unlocking the first gate but not the second gate; second unlocking means (for the telephone company) for unlocking the first gate without using the first unlocking means; a first set of terminals within the first compartment and a second set of terminals within the second compartment; a set of jacks within the first compartment in electrical communication with the second set of terminals; a set of jack plugs removably inserted into the jacks, each jack plug in electrical communication with the first set of terminals; and a plurality of first gate doors (for the possessors of individual building units) in the first gate, each gate door providing an access to a portion of the jacks when the gate door is opened. In the preferred embodiment, the second gate is between the first and second compartments. The particular configuration of the preferred embodiment allows the use of a container lid having a rubber gasket. Earlier network interface devices contained no gasket, but rather attempts to provide moisture protection by precise molding of the plastic parts. Such precise molding is not practical with the larger size unit of the current design. The placement of the second gate "within" the first gate and the novel opening mechanism disclosed allow a separate cover, with gasket, to be placed over the entire container.

In keeping with the terminology of the network interface field, the first compartment is the "customer" compartment and the first set of terminals are the "customer" terminals, and the second compartment and second set of terminals are the "telephone company" compartment and terminals respectively.

To allow the telephone company employee to "override" the locking devices of the building manager, the preferred embodiment provides a handle rotatably mounted on the containers; an arm rotated by the handle, the arm located within the first compartment; a latch piece in the first compartment comprising: (i) a plate between the arm and the second gate having a slot therein through which the arm is passable when the handle is rotated; and (ii) a loop mounted on the plate, the loop projecting through a first opening in the first gate when the first gate is closed; and a handle fastener preventing rotation of the handle unless the fastener is unfastened. A plurality of first gate doors are provided in the first gate, each gate door providing access to a portion of the first set of terminals when the gate door is opened. The individual first gate doors may be opened by those in possession of individual building units, while the first gate door is designed to be opened by the building manager or the telephone company; and the second gate door is designed to be opened by the telephone company only.

As an added feature, the container lid may have a perforated flange which allows a lock hasp to pass therethrough. The fastened handle passes through the hasp; therefore, the handle may be rotated by the telephone company without a lock key.

DETAILE0 DESCRIPTION OF THE PREFERRED EMBODIMENT

Figure 1:
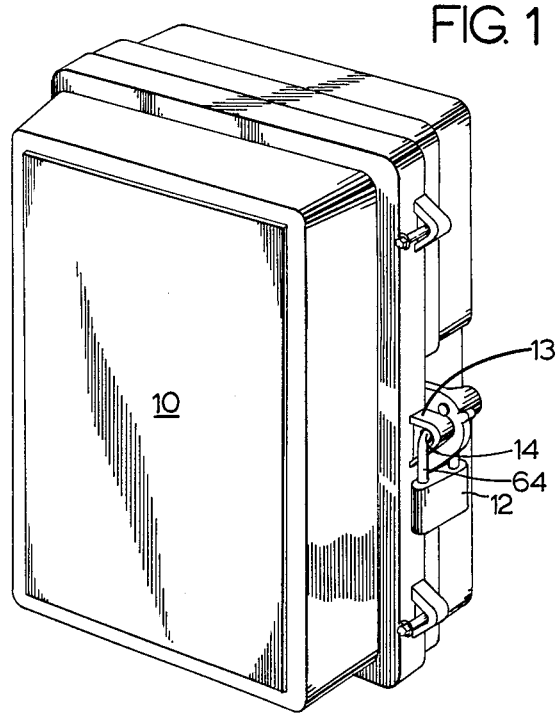
FIG. 1 is a perspective view of the container with the lid closed and fastened by a building manager's lock.

FIG. 1 shows a perspective view of the preferred embodiment of the invention with lid 10 closed. Building manager's lock 12 has hasp 64 passing through perforation 14 of lid flange 13; hasp 64 also passes around rotatable handle 24. The screws located near the top and bottom of the container are ordinary screws which may be opened by a screwdriver. The purpose of these screws is just to secure lid 10.

Figure 2:
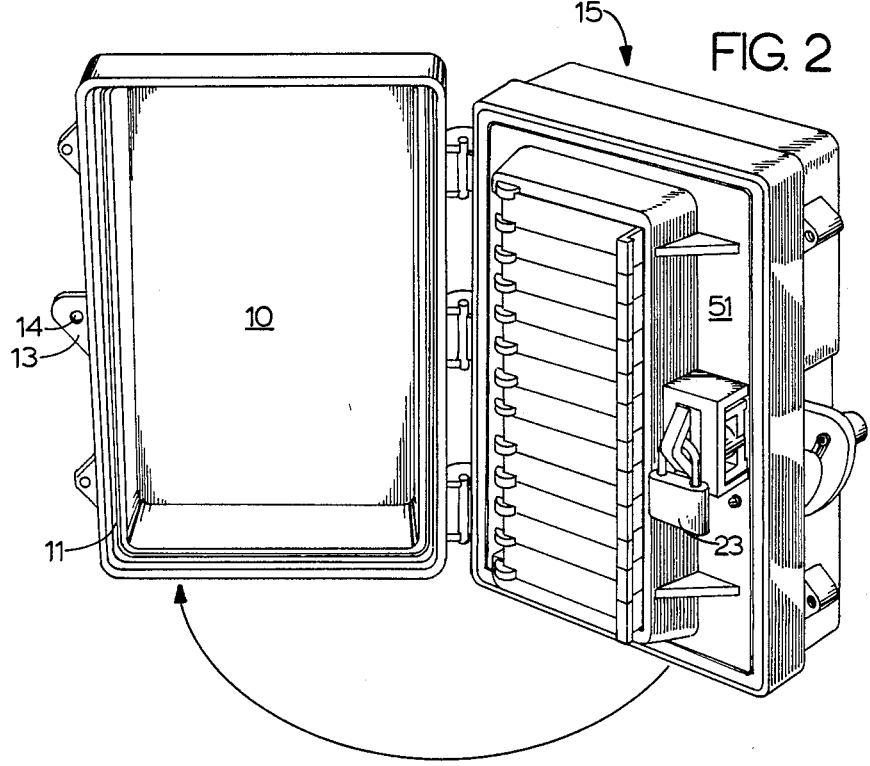
FIG. 2 shows the container with the lid open disclosing the first gate.

FIG. 2 shows lid 10 opened, lock 12 being removed. Further shown in lid 10 is gasket 11. Ridge 17 (FIG. 3) fits into gasket 11 to provide a snug, watertight fit. Opening lid 10 discloses the remaining portion 15 of the preferred embodiment, first gate 51 now being exposed to view. Building manager's lock 23 prevents first gate 51 from being opened at this point. First gate 51 closes the entranceway into the first compartment.

Figure 3:
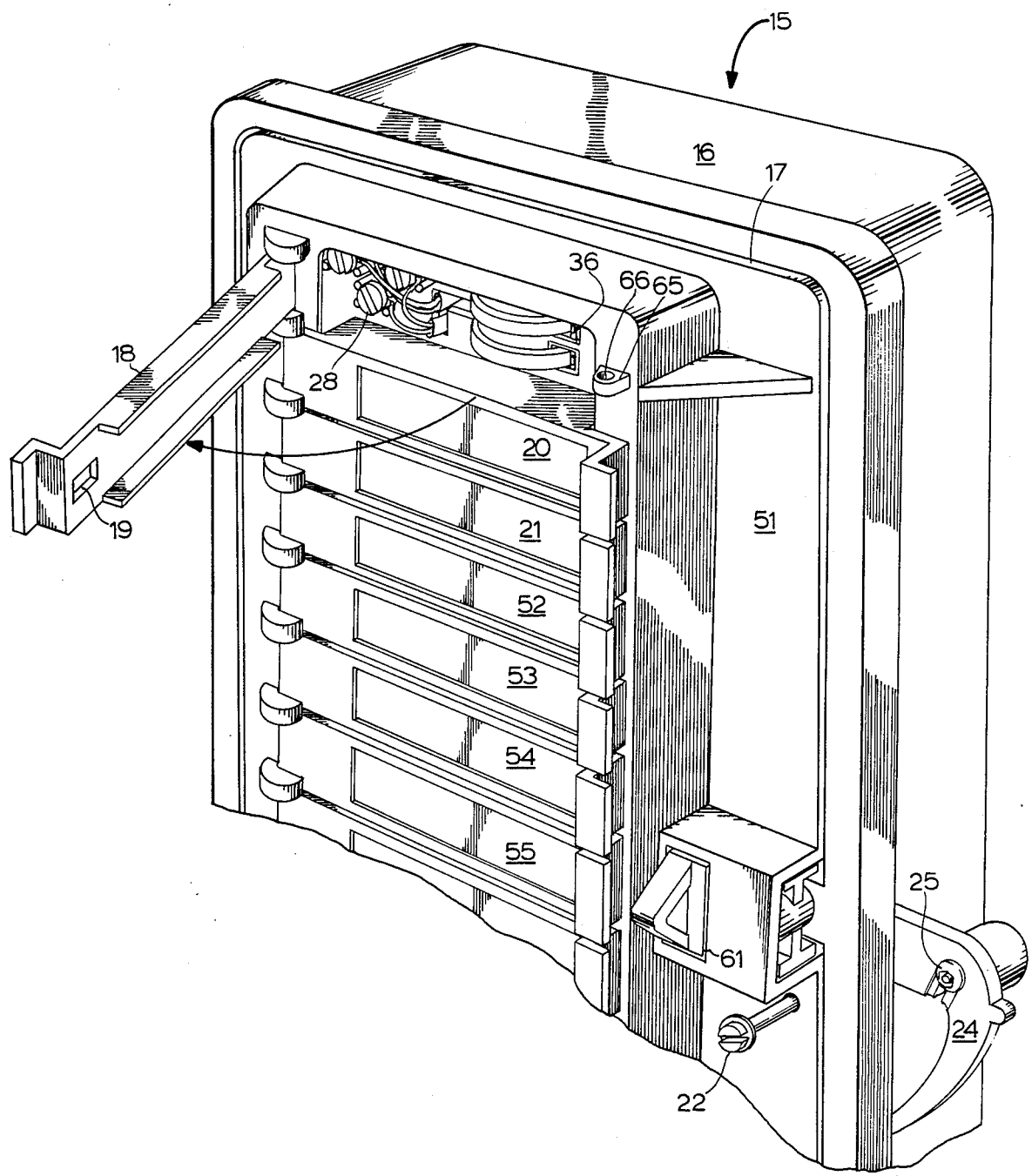
FIG. 3 shows a first gate door opened to disclose a portion of the first set of terminals and jacks.

FIG. 3 provides a more expanded view of first gate doors 18, 20, 21, 52, 53, 54, and 55. First gate door 18 has opening 19 providing a means for locking first gate door 18 by the possessor of an individual unit if that is desired. Flange 65 having hole 66 passes through opening 19 when first gate door 18 is closed, so a lock may be placed thereon. The remaining first gate doors may also be locked in this fashion if desired.

Opening first gate door 18 provides access to jack plug 36 and the jack into which it is inserted which are located in the first compartment.

First gate 51 is secured by regular screw 22, which may be opened by a common screwdriver. Special telephone company screw 25 has a smooth head and is designed to be opened only by a special telephone company tool. These special screws and tools are readily available on the open market. Special screw 25 fastens rotatably mounted handle 24. First gate 51 has opening 61 through which loop 32 (FIG. 4) projects.

Figure 4:
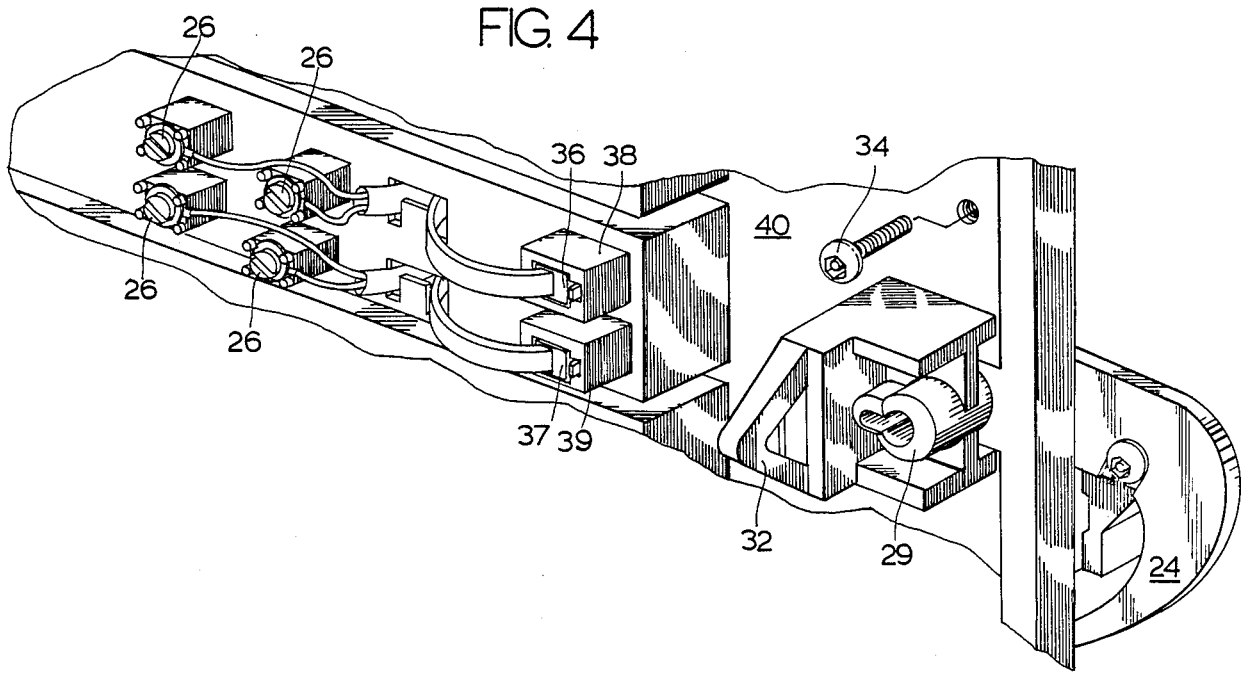
FIG. 4 is a cutaway view of the second gate which shows an expanded view of a portion of the first set of terminals, jack plugs, jacks, and the rotating handle.
Figure 5:
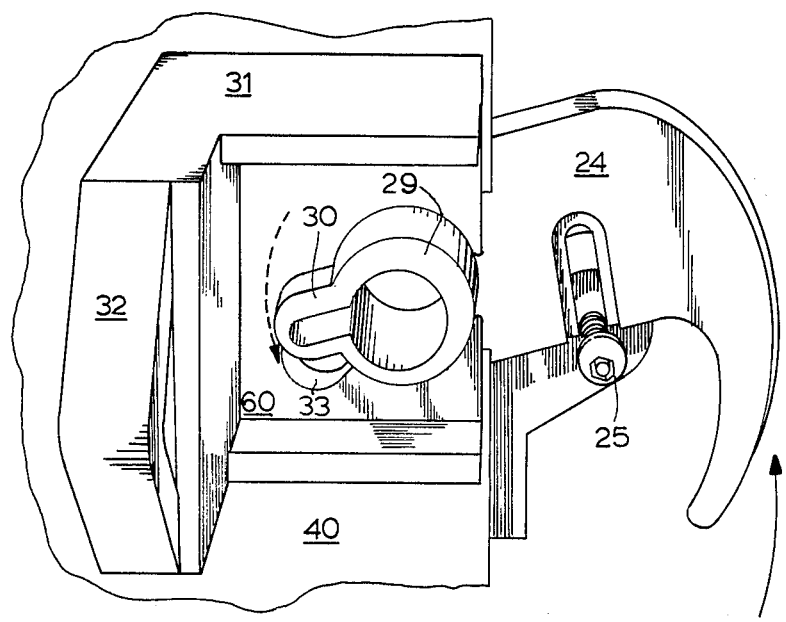
FIG. 5 is an expanded view showing interaction of the rotating door handle and arm in conjunction with the latch piece.

In FIG. 4 first gate 51 has been opened after removal of lock 23, exposing the first compartment and second gate 40 which closes the entranceway into the second compartment. A portion of the first set of terminals 26 are shown in electrical communication via wires leading to jack plugs 36-37, which are removably inserted into jack plugs 38-39. Referring to FIGS. 4 and 5, latchpiece 31 comprises plate 60, having slot 33, and also loop 32 mounted on plate 60, loop 32 designed to extend through opening 61 of first gate 51 (see FIG. 3) to provide a hangar for lock 23 (see FIG. 2). Referring back to FIGS. 4 and 5, when handle 24 is rotated, arm 30 is rotated by wheel 29. Slot 33 is shaped in order to allow arm 30 to pass through. Latchpiece 31 is separate, not mounted permanently either to first gate 51 or second gate 40.

One can, therefore unlock and open first gate 51 in two ways. The building manager may unlock lock 23 and unscrew screw 22. The telephone company employee, who has no key to lock 23, may unscrew special screw 25, rotate handle 24, causing arm 30 to align with slot 33. First gate 51, with latchpiece 31 still attached thereto by lock 23, may then be opened.

Lid 10 may be opened in two ways as well. Lock 12 may be unlocked, or rotation of handle 24 allows lid 10 to be opened even with lock 12 still locked.

Figure 6:
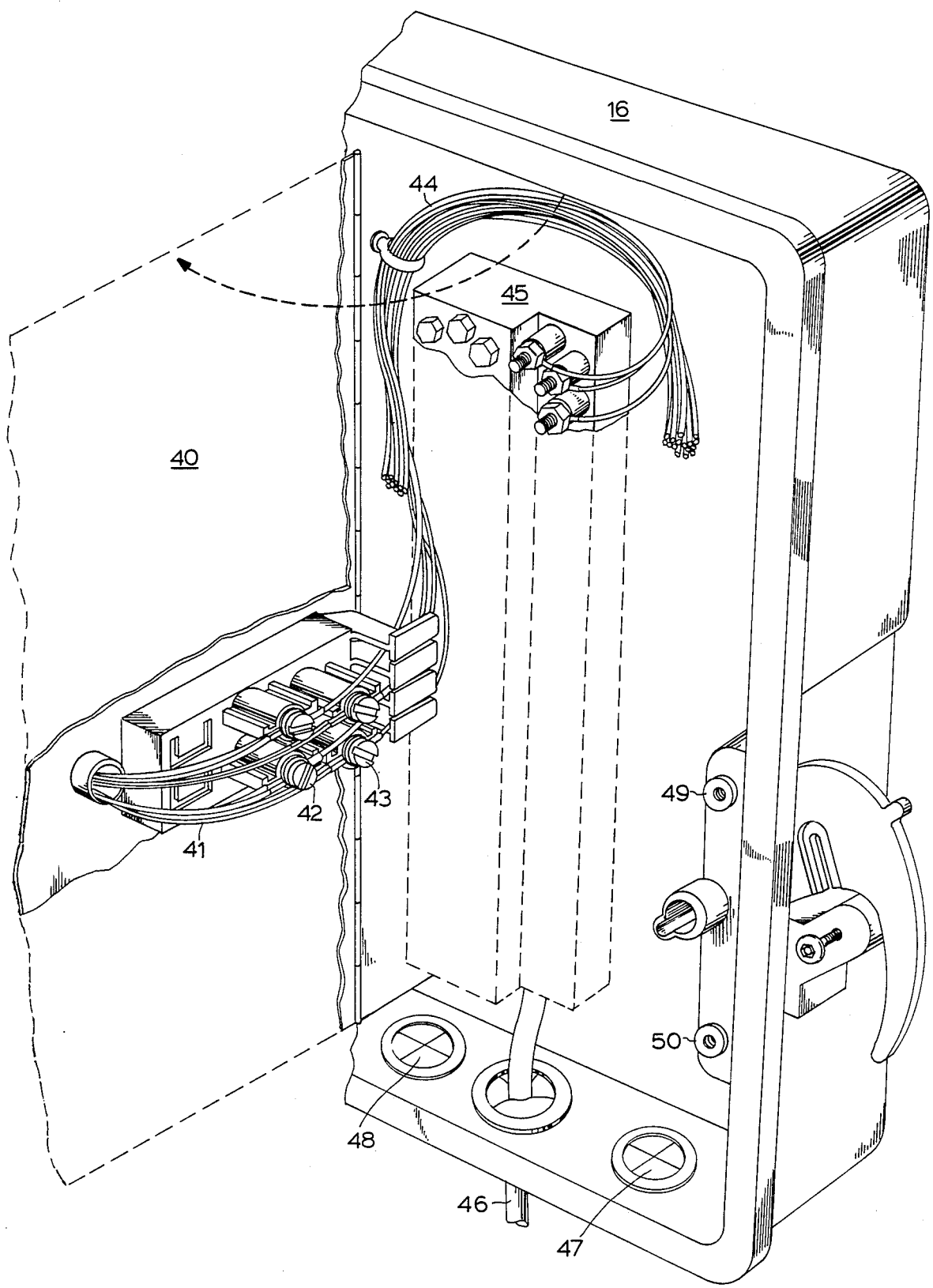
FIG. 6 is a perspective view of the second compartment, the second gate being opened.

FIG. 6 shows the second compartment, second gate 40 now opened. Wires 41 place the jacks in electrical communication with second set of terminals 42, 43 in the second compartment. A plurality of wires 44 lead to lighting arrestor 45. Screws 22, 34 seat into holes 50, 49, respectively.

I claim:
1. A network interface device comprising:
   (a) a container having at least first and second compartments therein, a first entranceway to the first compartment and a second entranceway to the second compartment;
   (b) a first gate for opening or closing the entranceway into the first compartment;
   (c) a second gate for opening or closing the entranceway into the second compartment;
   (d) first locking means for locking the first gate;
   (e) first unlocking means for unlocking the first gate but not the second gate;
   (f) second unlocking means for unlocking the first gate without using the first unlocking means;
   (g) a first set of terminals within the first compartment;
   (h) a second set of terminals within the second compartment;
   (i) a set of jacks within the first compartment in electrical communication with the second set of terminals;
   (j) a set of jack plugs removably inserted into the jacks, each jack plug in electrical communication with the first set of terminals; and
   (k) a plurality of first gate doors in the first gate, each gate door providing access to a portion of the jacks when the gate door is opened.

2. A network interface device as recited in claim 1, wherein the second gate is between the first and second compartments.

3. A network interface device comprising:
   (a) a container having a lid and at least first and second compartments therein, a first entranceway to the first compartment and a second entranceway to the second compartment;
   (b) a first gate for opening or closing the entranceway into the first compartment;
   (c) a second gate for opening or closing the entranceway into the second compartment;
   (d) second locking means for locking the lid;
   (e) first locking means for locking the first gate;
   (f) first unlocking means for unlocking the first gate;
   (g) lid unlocking means for unlocking the lid;
   (h) second unlocking means for unlocking the lid and first gate without using the first unlocking means or lid unlocking means;
   (i) a first set of terminals within the first compartment;

(j) a second set of terminals within the second compartment;

(k) a set of jacks within the first compartment in electrical communication with the second set of terminals; and (l) a set of jack plugs removably inserted into the jacks, each jack plug in electrical communication with the first set of terminals.

4. Apparatus as recited in claim 3, further comprising:

(a) a first set of terminals in the first compartment;

(b) a second set of terminals in the second compartment;

(c) a set of jacks in the first compartment in an electrical communication with the second set of terminals; and (d) a set of plugs in the first compartment in electrical communication with the first set of terminals, each said plug removably inserted into a jack.

5. Apparatus as recited in claim 4, further comprising a plurality of first gate doors in the first gate, each gate door providing access to a portion of the jacks when the gate door is opened.

6. Apparatus as recited in claim 5, further comprising a container lid having a perforated flange, and a lock having a hasp passing through the perforated flange and around the handle when the handle is fastened.

3. Apparatus comprising:

(a) a container having at least first and second compartments therein, an entranceway into the first compartment, and an entranceway into the second compartment;

(b) a first gate for opening or closing the entranceway into the first compartment, the first gate having a first opening therein;

(c) a second gate for opening or closing the entrance into the second compartment;

(d) a handle rotatably mounted on the container;

(e) an arm rotated by the handle, the arm located within the first compartment;

(f) a latchpiece in the first compartment comprising:

(i) a plate between the arm and the second gate having a slot therein through which the arm is passable when the handle is rotated; and (ii) a loop mounted on the plate, the loop projecting through the first opening in the first gate when the first gate is closed; and (g) a handle fastener preventing rotation of the handle unless the fastener is unfastened.

* * * * *

UNITED STATES PATENT OFFICE
CERTIFICATE OF CORRECTION

Patent No. 4,749,359                    Dated  June 7, 1988

Inventor(s)  Stephen D. White

It is certified that error appears in the above-identified patent and that said Letters Patent are hereby corrected as shown below:

In Column 6, line 3, replace the arabic numeral "3" with the arabic numeral --4--.

In Column 5, line 9, replace the arabic numeral "4" with the arabic numeral --5-- and replace the arabic numeral "3" with the arabic numeral --4--.

In Column 5, line 19, replace the arabic numeral "5" with the arabic numeral --6-- and replace the arabic numeral "4" with the arabic numeral --5--.

In Column 5, line 23, replace the arabic numeral "6" with the arabic numeral --7-- and replace the arabic numeral "5" with the arabic numeral --6--.

Signed and Sealed this

First Day of November, 1988

Attest:

DONALD J. QUIGG

*Attesting Officer*                    Commissioner of Patents and Trademarks